US012631685B2

(12) United States Patent
Randolph et al.

(10) Patent No.: US 12,631,685 B2
(45) Date of Patent: May 19, 2026

(54) INTELLIGENT PREDICTIVE BATTERY REPLACEMENT TO INCREASE DISASTER RECOVERY STABILITY

(71) Applicant: Dell Products, L.P., Hopkinton, MA (US)

(72) Inventors: Benjamin A. F. Randolph, Uxbridge, MA (US); Ramesh Doddaiah, Westborough, MA (US); Frederick Sproule, East Bridgewater, MA (US)

(73) Assignee: Dell Products, L.P., Hopkinton, MA (US)

( * ) Notice: Subject to any disclaimer, the term of this patent is extended or adjusted under 35 U.S.C. 154(b) by 515 days.

(21) Appl. No.: 18/208,340

(22) Filed: Jun. 12, 2023

(65) Prior Publication Data

US 2024/0410947 A1 Dec. 12, 2024

(51) Int. Cl.
*G01R 31/367* (2019.01)
*G01R 31/36* (2020.01)
*G01R 31/392* (2019.01)

(52) U.S. Cl.
CPC ....... *G01R 31/367* (2019.01); *G01R 31/3648* (2013.01); *G01R 31/392* (2019.01)

(58) Field of Classification Search
CPC . G01R 31/367; G01R 31/3648; G01R 31/392
See application file for complete search history.

(56) References Cited

U.S. PATENT DOCUMENTS

| | | | |
|---|---|---|---|
| 12,341,791 B1* | 6/2025 | DePalo ................ | G06F 11/3466 |
| 2020/0027044 A1* | 1/2020 | Sogawa ................. | G06N 20/20 |
| 2021/0109584 A1* | 4/2021 | Guim Bernat ...... | H04L 41/5045 |
| 2022/0292542 A1* | 9/2022 | Kaspar .............. | G06Q 30/0244 |

* cited by examiner

*Primary Examiner* — Ricky Go
(74) *Attorney, Agent, or Firm* — Anderson Gorecki LLP

(57) ABSTRACT

An intelligent predictive battery replacement system to increase disaster recovery stability uses training samples created using battery report indexes and vault condition recovery reports to train a linear regression model learning process to learn a recursion between battery post recovery charge and a set of time series battery operational parameters. Once trained, the learning process is used in a predictive manner to predict the post recovery charge state of batteries deployed in storage controllers, to provide a predictive per-battery risk assessment. The per-battery risk assessment identify batteries that may be scheduled to be replaced to increase disaster recovery stability of the storage systems. The risk assessment is also configured, in some embodiments, to identify environmental characteristics and/ or battery use characteristics that are primary reasons for battery replacement recommendations, to enable corrective action to be taken to extend the life of other batteries deployed in the storage system or data center.

20 Claims, 8 Drawing Sheets

Figure 3:
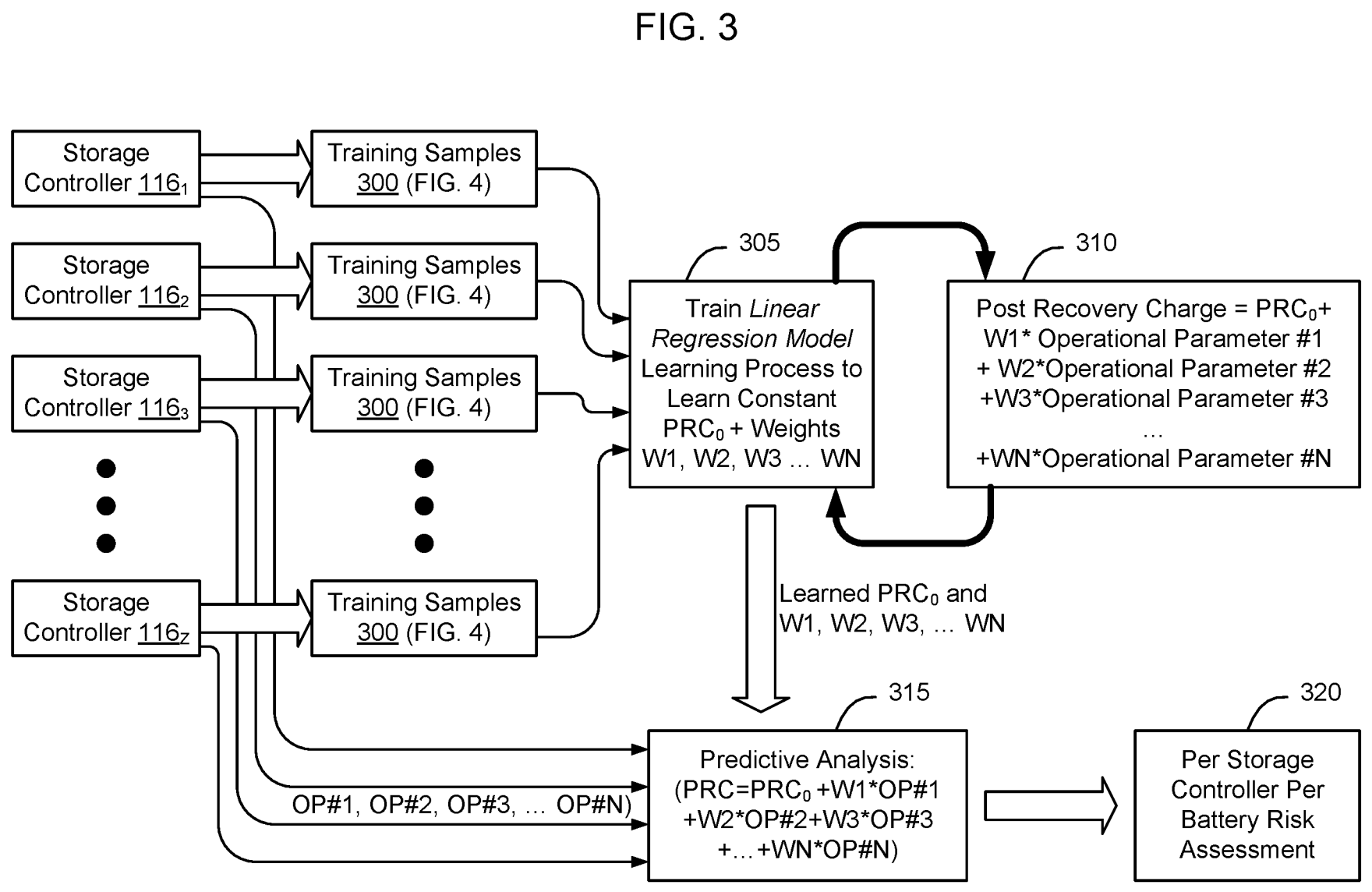

Storage Controller 116₁ → Training Samples 300 (FIG. 4)

Storage Controller 116₂ → Training Samples 300 (FIG. 4)

Storage Controller 116₃ → Training Samples 300 (FIG. 4)

• • •

Storage Controller 116_Z → Training Samples 300 (FIG. 4)

• • •

305

Train *Linear Regression Model* Learning Process to Learn Constant $PRC_0$ + Weights W1, W2, W3 .... WN

310

Post Recovery Charge = $PRC_0$ + W1* Operational Parameter #1 + W2*Operational Parameter #2 +W3*Operational Parameter #3 ... +WN*Operational Parameter #N Learned $PRC_0$ and W1, W2, W3, ... WN

315

Predictive Analysis: $(PRC = PRC_0 + W1*OP\#1 + W2*OP\#2 + W3*OP\#3 + ... + WN*OP\#N)$

OP#1, OP#2, OP#3, .... OP#N

320

Per Storage Controller Per Battery Risk Assessment

FIG. 8

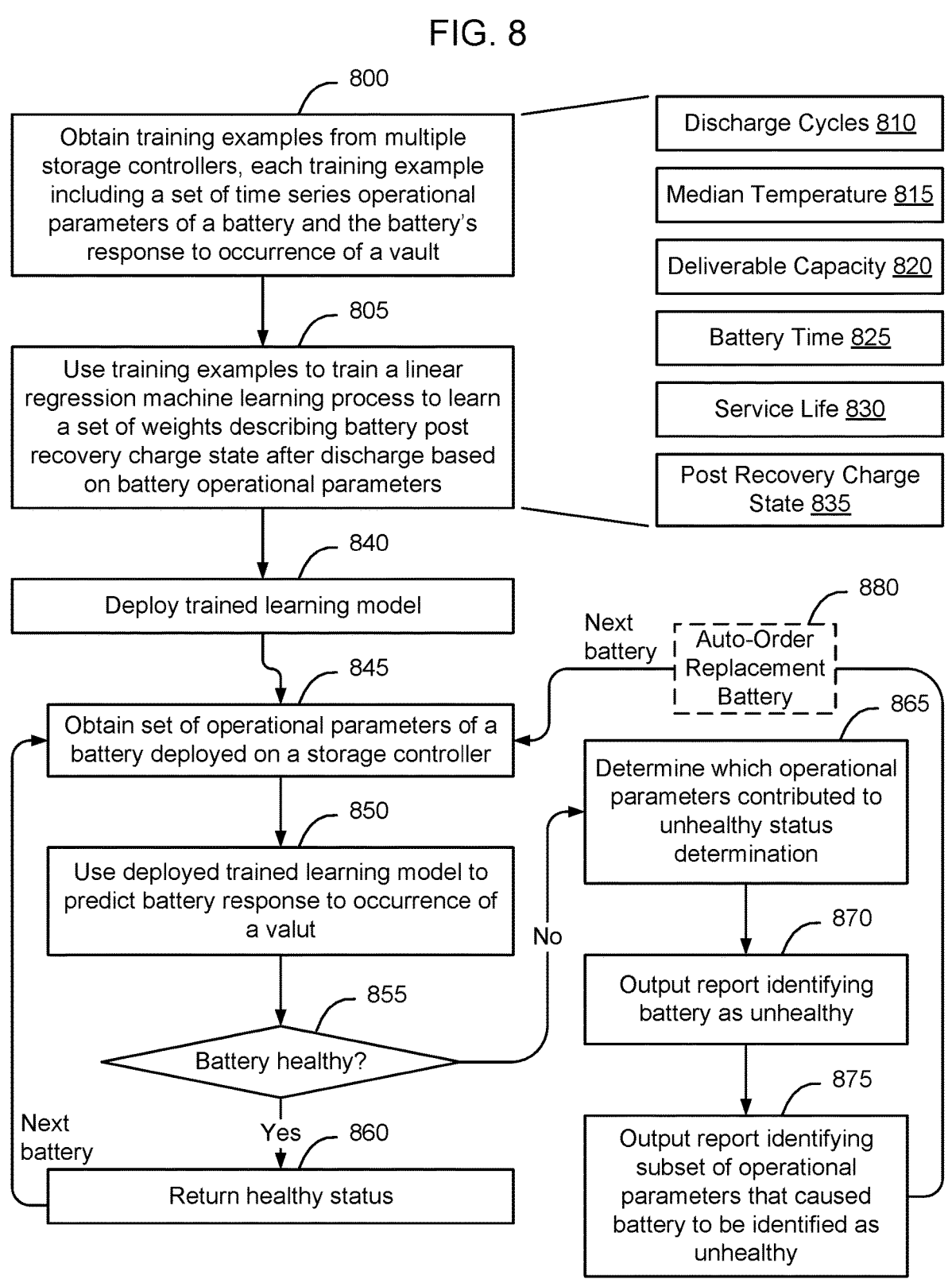

800
Obtain training examples from multiple storage controllers, each training example including a set of time series operational parameters of a battery and the battery's response to occurrence of a vault Discharge Cycles 810

Median Temperature 815

Deliverable Capacity 820

Battery Time 825

Service Life 830

Post Recovery Charge State 835

805
Use training examples to train a linear regression machine learning process to learn a set of weights describing battery post recovery charge state after discharge based on battery operational parameters

840
Deploy trained learning model

845
Obtain set of operational parameters of a battery deployed on a storage controller

850
Use deployed trained learning model to predict battery response to occurrence of a valut

855
Battery healthy?

Next battery

Yes 860
Return healthy status

Next battery

880
Auto-Order Replacement Battery

No

865
Determine which operational parameters contributed to unhealthy status determination

870
Output report identifying battery as unhealthy

875
Output report identifying subset of operational parameters that caused battery to be identified as unhealthy

INTELLIGENT PREDICTIVE BATTERY REPLACEMENT TO INCREASE DISASTER RECOVERY STABILITY

FIELD

This disclosure relates to computing systems and related devices and methods, and, more particularly, to a method and apparatus for intelligent predictive battery replacement to increase disaster recovery stability.

SUMMARY

The following Summary and the Abstract set forth at the end of this document are provided herein to introduce some concepts discussed in the Detailed Description below. The Summary and Abstract sections are not comprehensive and are not intended to delineate the scope of protectable subject matter, which is set forth by the claims presented below.

All examples and features mentioned below can be combined in any technically possible way.

In some embodiments, an intelligent predictive battery replacement system to increase disaster recovery stability uses training samples created using battery report indexes and vault condition recovery reports, to train a linear regression model learning process to learn a recursion between battery post recovery charge and a set of time series battery operational parameters. Once trained, the learning process is used in a predictive manner to predict the post recovery charge state of batteries deployed in storage controllers, to provide a predictive per-battery risk assessment. The per-battery risk assessment identify batteries that may be scheduled to be replaced to increase disaster recovery stability of the storage systems. The risk assessment is also configured, in some embodiments, to identify environmental characteristics and/or battery use characteristics that are primary reasons for battery replacement recommendations, to enable corrective action to be taken to extend the life of other batteries deployed in the storage system or data center.

In some embodiments, a method of intelligent predictive battery replacement to increase disaster recovery stability includes obtaining a trained linear regression model learning process that has been trained to learn a constant and a set of weights describing a regression between a set of battery operational parameters as explanatory variables and a battery post recovery charge state as a response variable, obtaining a set of operational parameters of a given battery, providing the obtained set of operational parameters of the given battery as input to the trained linear regression model learning process, obtaining, as output from the trained linear regression model learning process, a predicted post recovery charge state of the given battery, the post recovery charge state of the given battery describing an expected capacity of the given battery after being recharged after occurrence of a deep discharge event of the given battery, and using the predicted post recovery charge state of the given battery output by the trained linear regression model learning process to classify the given battery as either capable of meeting a vault Service Level Objective (SLO) or not capable of meeting the vault SLO.

In some embodiments, the trained linear regression model learning process is a machine learning model that has been trained using unlabeled training examples, each unlabeled training example including a time series set of battery report indexes and a vault condition recovery report. In some embodiments, each battery report index contains battery operational parameters for a given battery during a particular time interval. In some embodiments, the set of battery operational parameters includes a number of discharge cycles of the given battery, a median temperature of the battery, and an amount of time the given battery has been maintained in a charged state. In some embodiments, the vault condition recovery report is generated in connection with a deep discharge event of the given battery, and includes a percent battery charge state prior to the deep discharge event, a percentage battery discharge value during the deep discharge event, and a percentage battery post recovery charge state after the given battery has been recharged after conclusion of the deep discharge event. In some embodiments, the battery post recovery charge state is an amount of an original capacity of the given battery that the given battery is able to hold after the given battery is used to implement the deep discharge event.

In some embodiments, using the predicted post recovery charge state of the given battery output by the trained linear regression model learning process to classify the given battery as either capable of meeting the vault Service Level Objective (SLO) or not capable of meeting the vault SLO includes comparing the predicted post recovery charge state of the given battery with a threshold post recovery charge state associated with a minimum post recovery charge state required to meet the vault SLO.

In some embodiments, in response to a determination that the given battery is not capable of meeting the vault SLO, the method further includes generating a notification identifying the given battery as a candidate for replacement. In some embodiments, in response to a determination that the given battery is not capable of meeting the vault SLO, the method further includes identifying a primary operational parameter of the obtained set of operational parameters for the given battery that primarily contributed to the determination that the given battery is not capable of meeting the vault SLO, and including the identified primary operational parameter in the notification.

In some embodiments, in response to a determination that the given battery is not capable of meeting the vault SLO, the method further includes automatically ordering a replacement battery for the given battery.

In some embodiments, a system for intelligent predictive battery replacement to increase disaster recovery stability includes one or more processors and one or more storage devices storing instructions that are operable, when executed by the one or more processors, to cause the one or more processors to perform operations including obtaining a trained linear regression model learning process that has been trained to learn a constant and a set of weights describing a regression between a set of battery operational parameters as explanatory variables and a battery post recovery charge state as a response variable, obtaining a set of operational parameters of a given battery, providing the obtained set of operational parameters of the given battery as input to the trained linear regression model learning process, obtaining, as output from the trained linear regression model learning process, a predicted post recovery charge state of the given battery, the post recovery charge state of the given battery describing an expected capacity of the given battery after being recharged after occurrence of a deep discharge event of the given battery, and using the predicted post recovery charge state of the given battery output by the trained linear regression model learning process to classify the given battery as either capable of meeting a vault Service Level Objective (SLO) or not capable of meeting the vault SLO.

In some embodiments, the trained linear regression model learning process is a machine learning model that has been trained using unlabeled training examples, each unlabeled training example including a time series set of battery report indexes and a vault condition recovery report. In some embodiments, each battery report index contains battery operational parameters for a given battery during a particular time interval. In some embodiments, the set of battery operational parameters includes a number of discharge cycles of the given battery, a median temperature of the battery, and an amount of time the given battery has been maintained in a charged state. In some embodiments, the vault condition recovery report is generated in connection with a deep discharge event of the given battery, and includes a percent battery charge state prior to the deep discharge event, a percentage battery discharge value during the deep discharge event, and a percentage battery post recovery charge state after the given battery has been recharged after conclusion of the deep discharge event. In some embodiments, the battery post recovery charge state is an amount of an original capacity of the given battery that the given battery is able to hold after the given battery is used to implement the deep discharge event.

In some embodiments, using the predicted post recovery charge state of the given battery output by the trained linear regression model learning process to classify the given battery as either capable of meeting the vault Service Level Objective (SLO) or not capable of meeting the vault SLO includes comparing the predicted post recovery charge state of the given battery with a threshold post recovery charge state associated with a minimum post recovery charge state required to meet the vault SLO.

In some embodiments, in response to a determination that the given battery is not capable of meeting the vault SLO, the operations further include generating a notification identifying the given battery as a candidate for replacement. In some embodiments, in response to a determination that the given battery is not capable of meeting the vault SLO, the operations further include identifying a primary operational parameter of the obtained set of operational parameters for the given battery that primarily contributed to the determination that the given battery is not capable of meeting the vault SLO, and including the identified primary operational parameter in the notification.

In some embodiments, in response to a determination that the given battery is not capable of meeting the vault SLO, the operations further include automatically ordering a replacement battery for the given battery.

BRIEF DESCRIPTION OF THE DRAWINGS

Features and advantages of the present technique will become more apparent from the following detailed description of exemplary embodiments thereof, taken in conjunction with the accompanying drawings, in which:

FIG. 2 is a functional block diagram an example storage controller, according to some embodiments.

FIG. 3 is a block diagram of an example intelligent predictive battery replacement recommendation system to increase disaster recovery stability, according to some embodiments.

FIG. 8 is a flowchart of an example method of intelligent predictive battery replacement to increase disaster recovery stability, according to some embodiments.

DETAILED DESCRIPTION

Aspects of the inventive concepts can be described as being implemented in a storage system 100 connected to a host computer 102. Such implementations should not be viewed as limiting. Those of ordinary skill in the art may recognize that there are a wide variety of implementations of the inventive concepts in view of the teachings of the present disclosure.

Some aspects, features and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory tangible computer-readable medium. Furthermore, it will be understood by those of ordinary skill in the art that the computer-executable instructions may be executed on a variety of tangible processor devices, i.e., physical hardware. For ease of exposition, not every step, device or component that may be part of a computer or data storage system is described herein. Those of ordinary skill in the art will recognize such steps, devices, and components in view of the teachings of the present disclosure and the knowledge generally available to those of ordinary skill in the art. The corresponding machines and processes are therefore enabled and within the scope of the disclosure.

The terminology used in this disclosure is intended to be interpreted broadly within the limits of subject matter eligibility. The terms "logical" and "virtual" are used to refer to features that are abstractions of other features, e.g., and without limitation, abstractions of tangible features. The term "physical" is used to refer to tangible features, including but not limited to electronic hardware. For example, multiple virtual computing devices could operate simultaneously on one physical computing device. The term "logic" is used to refer to special purpose physical circuit elements, firmware, and/or software implemented by computer instructions that are stored on a non-transitory tangible computer-readable medium and implemented by multi-purpose tangible processors, and any combinations thereof.

Figure 1:
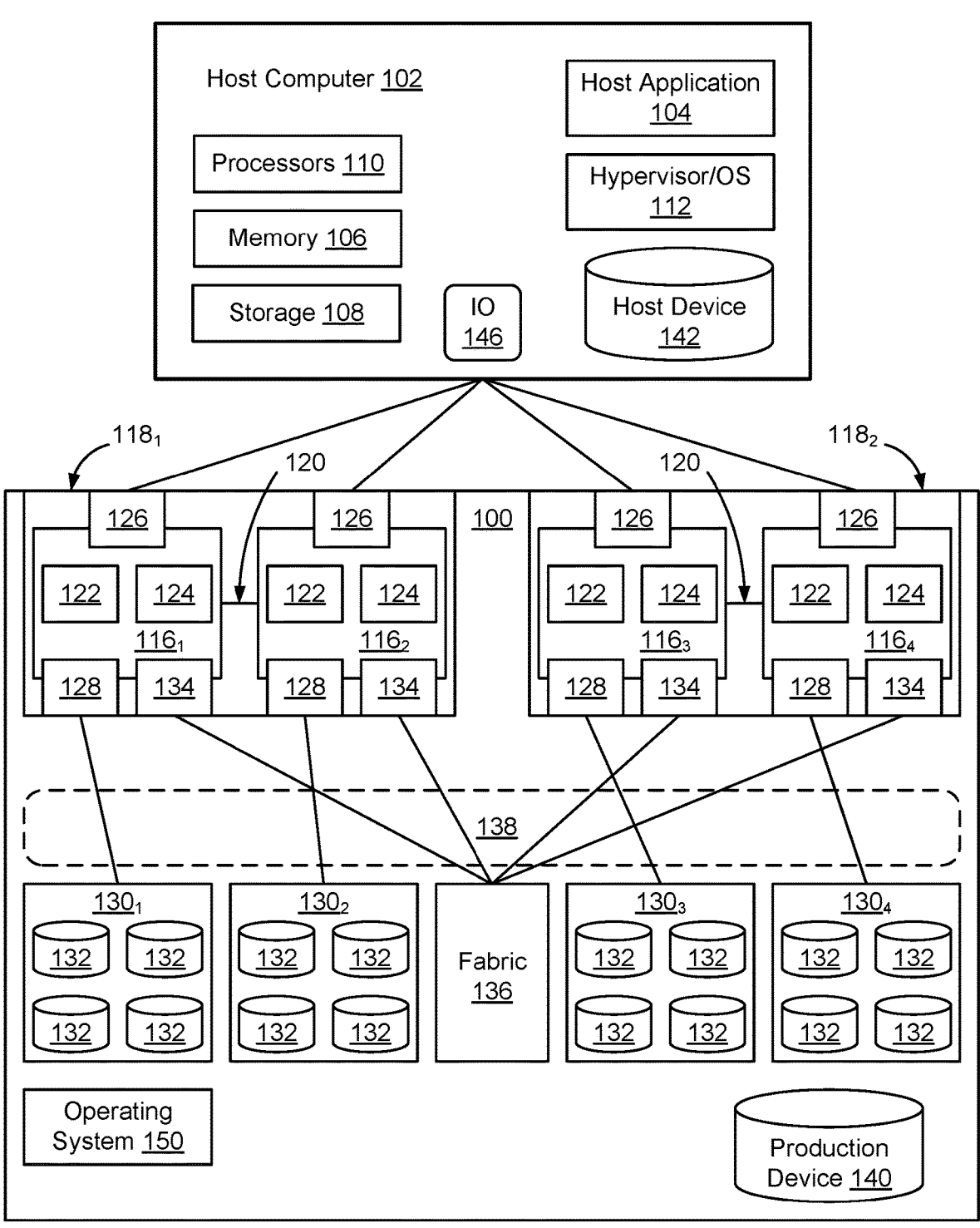
FIG. 1 is a functional block diagram of an example storage system connected to a host computer, according to some embodiments.

FIG. 1 illustrates a storage system 100 and an associated host computer 102, of which there may be many. The storage system 100 provides data storage services for a host application 104, of which there may be more than one instance and type running on the host computer 102. In the illustrated example, the host computer 102 is a server with host volatile memory 106, persistent storage 108, one or more tangible processors 110, and a hypervisor or OS (Operating System) 112. The processors 110 may include one or more multi-core processors that include multiple CPUs (Central Processing Units), GPUs (Graphics Processing Units), and combinations thereof. The host volatile memory 106 may include RAM (Random Access Memory) of any type. The persistent storage 108 may include tangible persistent storage components of one or more technology types, for example and without limitation SSDs (Solid State Drives) and HDDs (Hard Disk Drives) of any type, including but not limited to SCM (Storage Class Memory), EFDs (Enterprise Flash Drives), SATA (Serial Advanced Technology Attachment) drives, and FC (Fibre Channel) drives. The host computer 102 might support multiple virtual hosts running on virtual machines or containers. Although an external host computer 102 is illustrated in FIG. 1, in some embodiments host computer 102 may be implemented as a virtual machine within storage system 100.

The storage system 100 includes a plurality of compute nodes 116$_1$-116$_4$, possibly including but not limited to storage servers and specially designed compute engines, storage controllers, or storage directors for providing data storage services. In some embodiments, pairs of the compute nodes, e.g. (116$_1$-116$_2$) and (116$_3$-116$_4$), are organized as storage engines 118$_1$ and 118$_2$, respectively, for purposes of facilitating failover between compute nodes 116 within storage system 100. In some embodiments, the paired compute nodes 116 of each storage engine 118 are directly interconnected by communication links 120. In some embodiments, the communication links 120 are implemented as a PCIe NTB. As used herein, the term "storage engine" is used to refer to a storage engine, such as storage engines 118$_1$ and 118$_2$, which has a pair of (two independent) compute nodes, e.g. (116$_1$-116$_2$) or (116$_3$-116$_4$). A given storage engine 118 is implemented using a single physical enclosure and provides a logical separation between itself and other storage engines 118 of the storage system 100. A given storage system 100 may include one storage engine 118 or multiple storage engines 118.

Each compute node, 116$_1$, 116$_2$, 116$_3$, 116$_4$, includes processors 122 and a local volatile memory 124. The processors 122 may include a plurality of multi-core processors of one or more types, e.g., including multiple CPUs, GPUs, and combinations thereof. The local volatile memory 124 may include, for example and without limitation, any type of RAM. Each compute node 116 may also include one or more front-end adapters 126 for communicating with the host computer 102. Each compute node 116$_1$-116$_4$ may also include one or more back-end adapters 128 for communicating with respective associated back-end drive arrays 130$_1$-130$_4$, thereby enabling access to managed drives 132. A given storage system 100 may include one back-end drive array 130 or multiple back-end drive arrays 130.

In some embodiments, managed drives 132 are storage resources dedicated to providing data storage to storage system 100 or are shared between a set of storage systems 100. Managed drives 132 may be implemented using numerous types of memory technologies for example and without limitation any of the SSDs and HDDs mentioned above. In some embodiments the managed drives 132 are implemented using NVM (Non-Volatile Memory) media technologies, such as NAND-based flash, or higher-performing SCM (Storage Class Memory) media technologies such as 3D XPoint and ReRAM (Resistive RAM). Managed drives 132 may be directly connected to the compute nodes 116$_1$-

116$_4$, using a PCIe (Peripheral Component Interconnect Express) bus or may be connected to the compute nodes 116$_1$-116$_4$, for example, by an IB (InfiniBand) bus or fabric.

In some embodiments, each compute node 116 also includes one or more channel adapters 134 for communicating with other compute nodes 116 directly or via an interconnecting fabric 136. An example interconnecting fabric 136 may be implemented using PCIe (Peripheral Component Interconnect Express) or InfiniBand. Each compute node 116 may allocate a portion or partition of its respective local volatile memory 124 to a virtual shared memory 138 that can be accessed by other compute nodes 116 over the PCIe NTB links.

The storage system 100 maintains data for the host applications 104 running on the host computer 102. For example, host application 104 may write data of host application 104 to the storage system 100 and read data of host application 104 from the storage system 100 in order to perform various functions. Examples of host applications 104 may include but are not limited to file servers, email servers, block servers, and databases.

Logical storage devices are created and presented to the host application 104 for storage of the host application 104 data. For example, as shown in FIG. 1, a production device 140 and a corresponding host device 142 are created to enable the storage system 100 to provide storage services to the host application 104.

The host device 142 is a local (to host computer 102) representation of the production device 140. Multiple host devices 142, associated with different host computers 102, may be local representations of the same production device 140. The host device 142 and the production device 140 are abstraction layers between the managed drives 132 and the host application 104. From the perspective of the host application 104, the host device 142 is a single data storage device having a set of contiguous fixed-size LBAs (Logical Block Addresses) on which data used by the host application 104 resides and can be stored. However, the data used by the host application 104 and the storage resources available for use by the host application 104 may actually be maintained by the compute nodes 116$_1$-116$_4$ at non-contiguous addresses (tracks) on various different managed drives 132 on storage system 100.

In some embodiments, the storage system 100 maintains metadata that indicates, among various things, mappings between the production device 140 and the locations of extents of host application data in the virtual shared memory 138 and the managed drives 132. In response to an IO (Input/Output command) 146 from the host application 104 to the host device 142, the hypervisor/OS 112 determines whether the IO 146 can be serviced by accessing the host volatile memory 106. If that is not possible then the IO 146 is sent to one of the compute nodes 116 to be serviced by the storage system 100.

In the case where IO 146 is a read command, the storage system 100 uses metadata to locate the commanded data, e.g., in the virtual shared memory 138 or on managed drives 132. If the commanded data is not in the virtual shared memory 138, then the data is temporarily copied into the virtual shared memory 138 from the managed drives 132 and sent to the host application 104 by the front-end adapter 126 of one of the compute nodes 116$_1$-116$_4$. In the case where the IO 146 is a write command, in some embodiments the storage system 100 copies a block being written into the virtual shared memory 138, marks the data as dirty, and creates new metadata that maps the address of the data on the production device 140 to a location to which the block is written on the managed drives 132.

In a storage system with multiple fabric-connected enclosures, maintaining customer data integrity and data models is increasingly complex. In the event of a power outage, whether transitory or extended, any customer data that is stored in volatile memory such as RAM may be moved to persistent memory to prevent the data from being lost. The process of moving data from volatile memory to persistent memory is referred to herein as a "vault" process.

Storage arrays are designed to recover volatile customer data and metadata in case of a disaster event. In some embodiments, the storage system has a plurality of storage engines, and each storage engine has a pair of compute nodes. Each compute node has volatile memory that is used to store data on the compute node. In the event of a power failure, a vault process is implemented in which data and metadata is moved from volatile memory to persistent memory, such as to a flash drive. Vault operations are implemented when the system is powered down, goes offline, or if an environmental condition occurs such as the loss of a data center due to an air conditioning failure.

In some embodiments, each storage array includes a plurality of standby power supply modules. The standby power supply modules may be implemented, in some embodiments, as batteries physically located on each of the compute nodes. For example, to enable data to be vaulted, each physical enclosure within the storage system 100 is provided with a battery that can supply power to the physical components that are located within the physical enclosure. Each compute node is implemented as a separate physical board within the storage array, and by providing a standby power supply module on the physical board it is possible to provide power to the board during the vault process, to thereby provide enhanced likelihood that the data and metadata located in volatile memory on the compute node is able to be moved to persistent memory.

In some embodiments, during a vault operation, IO operations are stopped on the compute node, and data stored in shared global memory (volatile memory) is written to persistent memory. Optionally, two copies of each slot of shared global memory may be written to persistent memory, depending on the implementation. Once the data and metadata has been written to persistent memory, the vault process completes and the compute node is able to power down. When power is restored, or otherwise when the compute node is to be restored, a startup program initializes the hardware and the environmental system, and restores the system mirrored cache contents from the saved data in persistent memory while checking data integrity.

Depending on the particular implementation, the amount of shared global memory on each compute node may include multiple terabytes of data. Accordingly, during the vault operation, terabytes of data from volatile memory (DRAM) is written to persistent memory (flash drives), which may be done using the power provided by the batteries in the standby power supply modules.

In some embodiments, the batteries used to implement the standby power supply modules on each compute node are designed to provide enough power to meet a particular storage controller vault process Service Level Objective (SLO). One example vault SLO might be, for example, for the batteries to provide sufficient power to enable the storage controller to undergo two back-to-back vault operations in the event of a power outage, as well as to provide additional power to enable the compute node to implement an Initial Microprocessor Load (IML) bootup process once the conditions that caused the vault operation have ended. Other battery vault SLOs might specify other power conditions that the batteries may be designed to meet, and the particular battery vault SLO can depend on the particular implementation.

Unfortunately, batteries deteriorate over time, such that it is possible for a battery or set of batteries that were initially designed to provide sufficient power to meet a particular vault SLO to no longer be able to meet the vault SLO parameters. Specifically, batteries are shipped at a specification to provide enough power to meet a particular SLO for a given hardware configuration. However, external factors may contribute to unexpected battery capacity degradation, that can reduce the battery life and, accordingly, affect the ability of the battery to provide sufficient power to effectively complete the vault process. Failure to complete the vault process can result in data unavailability and data loss.

According to some embodiments, a machine learning linear regression model is trained to classify batteries based on historical operational parameters of the battery to predict a post recovery charge state for the battery after occurrence of a deep discharge event such as associated with a vault operation. Measurements of actual vault recovery performance/charge state from field and in-house events are used, in connection with temperature, discharge cycle, battery life, and other operational parameters, to train the machine learning linear regression model. Once trained, the machine learning model is used to classify deployed batteries using a plurality of categories, such as high risk or good state, based on learned thresholds. The machine learning model uses the learned weights of the linear regression model, the learned thresholds, and battery operational parameters to classify batteries to generate battery replacement recommendations based on early detection of when the batteries are determined to be unlikely to meet vault SLO parameters.

In addition, in some embodiments, the machine learning model specifies the contributions of the factors that caused the battery to be classified for replacement, to enable the root cause of the battery replacement recommendation to be specified. In instances where the root cause of early battery replacement recommendations is able to be remediated, this enables remedial action to be implemented as well as battery replacement to reduce the frequency of future premature battery replacements. For example, in some embodiments high mean battery temperature can result in the need for more frequent battery replacement. In instances where the machine learning model identifies a battery as requiring replacement, and the primary reason for battery replacement is the presence of a high mean battery temperature, specifying the high mean battery temperature as the reason for the battery replacement recommendation enables the conditions in the data center to be changed by adjusting the amount of air conditioning used to cool the data center containing the storage system. This enables the customer to take actions to mitigate future problems, in addition to notifying the customer to replace the battery before occurrence of a subsequent vault operation.

In some embodiments, the machine learning model is a linear regression model trained to learn battery post recovery charge state based on a number of operational parameters of the battery over time. As used herein, the term "post recovery charge state" refers to the amount of the original capacity of the battery that the battery is able to hold after the battery is used to implement a deep discharge operation such as a vault operation or two back-to-back vault operations. For example, a battery with a "post recovery charge state" of 80% refers to a battery that is able to be charged to 80% of its original capacity after undergoing a deep discharge event, such as an event associated with a vault operation.

A linear regression model, as that term is used herein, is a machine learning model that uses unlabeled training data to learn a series of weights to be applied to a set of operational parameters to predict the post recovery charge state of the battery. For example, in some embodiments the linear regression model is trained to learn weights with gradient decent to be applied to each of a group of selected operational parameters. For example, the linear regression model may learn weights to be used in the following equation:

$$PRC_{EST} =$$
$$PRC_0 + W1^*OP\ \#1 + W2^*OP\ \#2 + W3^*OP\ \#3 + \ldots + WN^*OP\ \#\ N$$

where $PRC_{EST}$ is the estimated Post Recovery Charge State of the battery, $PRC_0$ is a learned constant, W1, W2, W3, . . . . WN are learned weights, and OP #1, OP #2, OP #3, . . . . OP #N are selected respective operational parameters that have been identified as having a statistically meaningful effect on the ability of the battery to recover over time, after occurrence of a deep discharge event such as a discharge event associated with a vault operation.

In some embodiments, the operational parameters are selected in advance. For example, when setting out to train the linear regression model an operator may specify that particular operational parameters are included in the model when the model is trained to learn the regression between operational parameters and battery post recovery charge state. An example selection of operational parameters might include the number of battery discharge cycles, the battery median temperature, the initial deliverable capacity of the battery, the amount of time the battery has been in service, and the anticipated service life of the battery. Other operational parameters might be selected to be used to train the linear regression model, depending on the implementation.

In some embodiments, the operational parameters are not selected in advance, and a set of relevant operational parameters are identified during the process of training the linear regression model. For example, in instances where the linear regression model is trained to learn weights and gradient decent of each operational parameter, during training the linear regression model may identify particular operational parameters that are learned to have very low weights, meaning that the particular operational parameters do not meaningfully affect the post recovery charge state of the battery. In this manner, the linear regression model may identify one or more operational parameters as not statistically significantly affecting the post recovery charge state of batteries and, hence, discard those operational parameters from the trained linear regression model.

In some embodiments, different sized batteries with different capacities, and/or batteries manufactured by different manufacturers, might have different characteristics and behave differently. Accordingly, although some embodiments are described in which a single linear regression model is trained and used to implement battery replacement predictions, it may be understood that multiple linear regression models might be trained for different battery capacities and/or manufacturers depending on the implementation.

Figure 2:
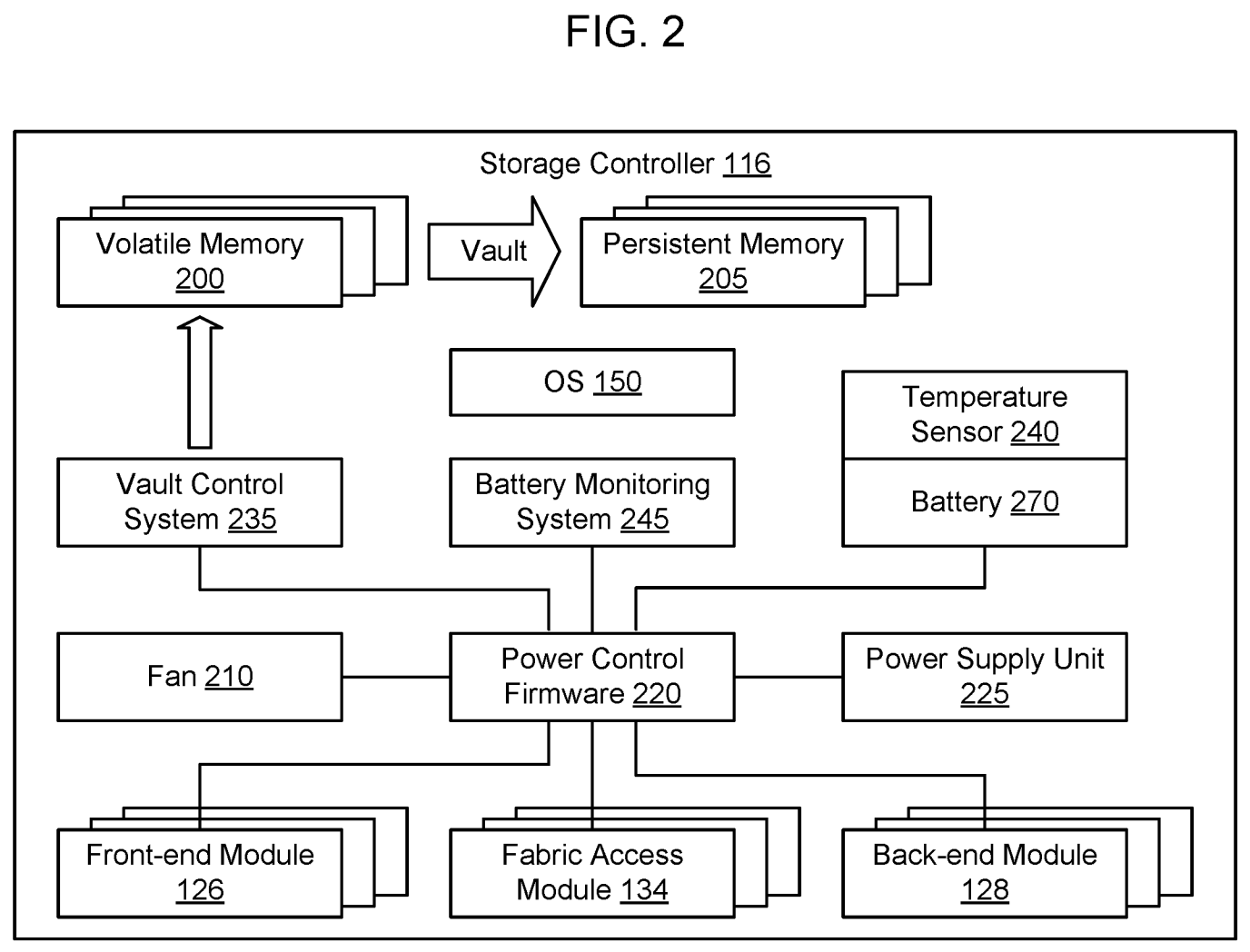

FIG. 2 is a functional block diagram an example storage controller 116, according to some embodiments. As shown in FIG. 2, in some embodiments a storage controller 116 includes volatile memory 200 and persistent memory 205. Although some embodiments are described in which the persistent memory 205 is included in the storage controller 116, it may be understood that the persistent memory 205 may be implemented separate from the storage controller 116, but powered by the battery 270.

As used herein, the term volatile memory 200 is used to refer to a memory that requires power to maintain stored information. Volatile memory 200 retains its contents while powered on, but when the power is interrupted, the stored data is quickly lost. Example forms of volatile memory 200 include most types of Random Access Memory (RAM) such as Static RAM (SRAM) and Dynamic RAM (DRAM). Other types of volatile memory 200 might be used as well, depending on the implementation, and the above-described memory types are merely intended as examples of volatile memories.

The term persistent memory 205, as used herein, is used to refer to a memory that does not require power to maintain stored information. Persistent memory 205 retains its contents both while powered on, as well as when power is interrupted or when power is turned off. Example forms of persistent memory 205 include flash memory, solid state drives and other types of computer data storage devices such as disk storage, hard disk drives, optical disks, and magnetic tape. Other types of persistent memory 205 might be used as well, depending on the implementation, and the above-described memory types are merely intended as examples of persistent memories.

In some embodiments, the storage controller 116 has a power supply unit 225 that provides power to power control firmware 220. During normal operation, the power supply unit 225 receives power from an external power source and provides power to components of the storage controller 116, such as front-end module 126, fabric access module 134, back-end module 127, volatile memory 200, and persistent memory 205. The power supply unit 225 also provides power to battery 270 to charge the battery 270 and maintain the battery 270 in a charged state. The storage controller 116 may also have other components, such as a fan 210 and a battery monitoring system 245, which are also powered by power supply unit 225. If power from the power supply unit 225 is interrupted, power control firmware 220, optionally in connection with operating system 150, causes vault control system 235 to implement a vault operation in which data stored in volatile memory 200 is copied to persistent memory 205. Power from the battery 270 is used to implement the vault operation, as well as to complete an organized power-down process of the storage controller 116 under the control of the power control firmware 220.

As noted above, volatile memory 200 uses power to maintain data. According to some embodiments, power from the battery 270 is provided to the volatile memory 200 during the vault operation, to increase the likelihood that data stored in the volatile memory 200 is not lost before it is able to be copied to persistent memory 205. In this manner, it is possible to use volatile memory 200 on storage controller 116, which may have higher performance characteristics, while ensuring that the data stored in the volatile memory 200 is not lost in the event of a power failure.

However, if the battery 270 does not have sufficient energy to implement the vault operation, any data contained in the volatile memory 200 that is not transferred to the persistent memory 205 can be lost. In some embodiments, the battery capacity is selected to meet particular vault SLO parameters. Example vault SLO parameters might be, for example, that the battery 270 is designed to have sufficient capacity to provide energy to the storage controller 116 for two consecutive vault operations as well as to provide power to the storage controller 116 for a subsequent Initial Microprocessor Load (IML) boot process. Other vault SLO parameters might be specified as well, depending on the particular implementation.

Batteries degrade over time, such that the capacity of the battery 270 would be expected to change over time. For example, the capacity of a battery 270 might change over time, such that after being in service for a few years the battery capacity might be a fraction of the original battery capacity. Example factors that can affect battery capacity degradation include the impact of charging and discharging rate, the temperature of the battery 270, and the age and history of the battery 270. Numerous operating parameters can affect the battery capacity. Once the capacity of the battery 270 has reduced to a point where the battery 270 no longer has sufficient capacity to meet the designed vault SLO parameters, the battery 270 may need to be replaced to increase the likelihood that data stored in volatile memory 200 is not lost because the battery 270 ran out of power during the vault operation.

Accordingly, knowing when to replace battery 270 is important to ensuring that data stored on storage controller 116 is not lost. However, knowing when to replace batteries may be difficult to determine, since environmental characteristics of particular storage controllers 116, battery usage, battery testing, the frequency of power outages, the frequency of vault operations, and numerous other factors may change how quickly the battery capacity diminishes over time. Further, multiple batteries of the same type may have their capacity change differently over time, even when exposed to the same environmental and usage characteristics. In a data center with hundreds of storage systems 100, each of which has multiple storage controllers 116, and each storage controller 116 possibly having multiple batteries 270, it becomes difficult to accurately determine whether a particular battery 270 needs to be replaced. Replacing batteries preemptively before the battery's capacity has been diminished is bad from both a cost and an environmental standpoint. Not replacing batteries preemptively before the battery's capacity has been diminished is bad from a data security standpoint.

According to some embodiments, a method and apparatus for intelligent predictive battery replacement to increase disaster recovery stability is provided. The intelligent predictive battery replacement system, in some embodiments, uses training samples created using battery reports indexes and vault condition recovery reports to train a linear regression model learning process to learn a recursion between battery post recovery charge capacity and a set of time series battery operational parameters. Once trained, the learning process is used in a predictive manner to predict the post recovery charge capacity state of deployed batteries, to provide a predictive per storage controller 116 per battery 270 risk assessment. The risk assessment enables batteries to be identified that may be scheduled to be replaced, to increase disaster recovery stability of the storage controllers 116 of the storage systems 100. The risk assessment is also configured, in some embodiments, to identify environmental characteristics and/or battery 270 use characteristics that are primary reasons for battery 270 replacement recommendations, to enable corrective action to be taken to extend the life of other batteries deployed in the storage system or data center.

FIG. 3 is a block diagram of an example intelligent predictive battery replacement recommendation system to increase disaster recovery stability, according to some embodiments. As shown in FIG. 3, in some embodiments each storage controller 116 provides training examples 300 that are used to train a linear regression model learning process, to cause the learning process to learn a constant $PRC_0$, and weights W1, W2, W3, . . . . WN, for each of a plurality of operational parameters, describing a regression between the operational parameters and battery post recovery charge state.

A linear regression model describes the relationship between a dependent variable, y, and one or more independent variables, x. The dependent variable is also called the response variable. Independent variables are also called explanatory or predictor variables. In some embodiments, the linear regression model 305 is trained to learn the post recovery charge of a battery 270 after a vault operation (response variable), based on a set of operational parameters 410 of the battery 270 (explanatory variables). The post recovery charge, as that term is used herein, refers to the amount of capacity of the battery 270 after the battery 270 has been fully charged after being depleted during a vault operation. The post recovery charge thus represents the amount of battery capacity, or energy, that the battery 270 is able to hold after undergoing a deep discharge event.

The operational parameters, in some embodiments, are measured over time. For example, the operational parameters of the battery 270 may be reported daily, weekly, or at some other time interval. The operational parameters are stored and, when a vault operation occurs, the battery response is measured and reported. The post recovery charge value of the battery 270 is then used, together with the time series operational parameters, as a training sample 300 to be used as a data point for training the linear regression model 305. A power failure might affect an entire storage system, and hence the vault operation might occur on multiple storage controllers 116 simultaneously in connection with a given power outage. Each battery 270 that is involved in a respective vault operation can subsequently be charged, and used to create a respective training sample.

As shown in FIG. 3, in some embodiments, the linear regression model is trained to learn a constant $PRC_0$ and a weighted combination of predictor variables (battery operational parameters) and to generate predictions of battery post recovery charge capacity using the following equation:

$$PRC = PRC_0 + W1^*OP\ \#1 +$$

$$W2^*OP\ \#2 + W3^*OP\ \#3 + \ldots + WN^*OP\ \#\ N.$$

<div align="right">Equation 1</div> where:
  PRC=Post Recovery Charge state of a given battery;
  $PRC_0$ is a learned constant; and
  W1, W2, W3, . . . . WN are learned weights; and
  OP1, OP2, OP3, . . . . OPN are the observed operational
    parameter values for the given battery. Some of the
    operational parameter values may be fixed values based
    on the characteristics of the battery, for example the
    initial battery capacity. Some of the operational parameter values may be determined over time, such as being
    based on a number of discharge cycles of the battery
    over time or the average battery temperature over the
    lifetime of the battery. Some operational parameter
    values may be point in time values based on the
    operational parameter of the battery at the time of
    occurrence of the vault, such as the instantaneous temperature of the battery at the time of occurrence of the vault event or the maximum temperature experienced by the battery during the vault or when being charged after occurrence of the vault.

Figure 4:
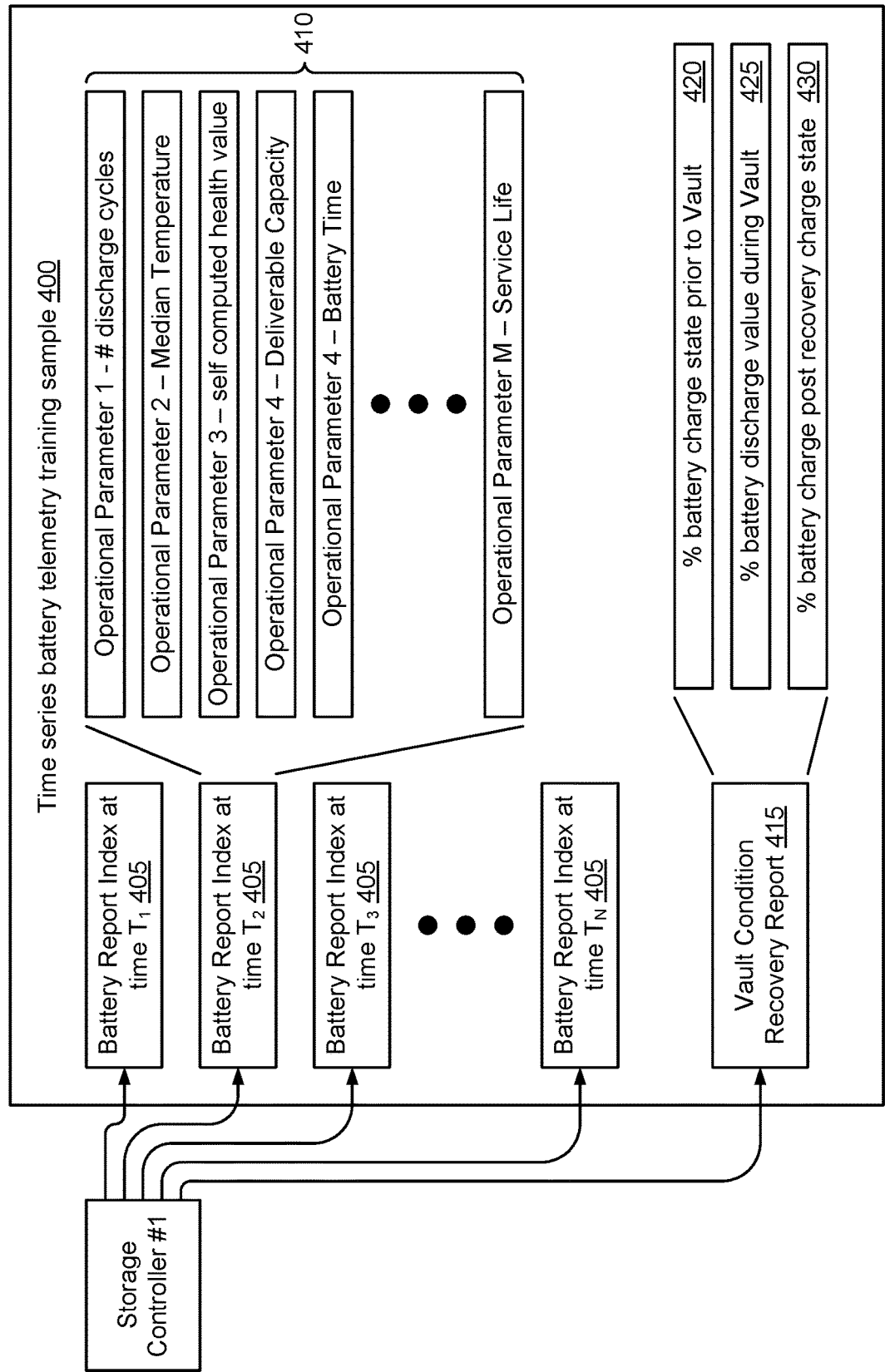
FIG. 4 is a block diagram of an example training sample for use in the example intelligent predictive battery replacement recommendation system of FIG. 3, according to some embodiments.

FIG. 4 is a block diagram of an example training sample for use in the example intelligent predictive battery replacement recommendation system of FIG. 3, according to some embodiments. As shown in FIG. 4, in some embodiments the time series battery telemetry training example includes a plurality of battery report indexes 405 created at a selected set of time intervals for a given battery. A battery report indexes 405 is periodically generated for each battery 270, which includes values of a set of selected operational parameters 410 for the battery 270 during the time interval represented by the battery report index 405. Example operational parameters 410 in FIG. 4 include a number of battery discharge cycles, a median battery temperature, a self-computed battery health value, a deliverable capacity, a battery time representing the current age of the battery 270, and an expected service life of the battery 270. Other operational parameters 410 may be reported as well, depending on the particular implementation.

Over time, a number of battery report indexes 405 are collected. Optionally, a given operational parameter 410 from the multiple reports may be combined, for example to form an average value of the operational parameter over time. For example, if one of the operational parameters is battery temperature, the reported battery temperature from multiple battery report indexes may be averaged to determine the average battery temperature over time.

When a vault operation occurs, a vault condition recovery report 415 is created which includes features describing the battery charge state before, during, and after the vault operation. For example, as shown in FIG. 4, in some embodiments the vault condition recovery report 415 includes the percentage battery 270 charge state prior to the vault operation, the percentage battery 270 charge state upon completion of the vault operation and prior to initiating a battery 270 recharge operation, and the percentage battery 270 charge state post recovery, namely the amount of capacity of the battery 270 after the battery 270 has been completely charged after the vault operation. The time series set of battery report indexes 405 at times T1, T2, T3, . . . . TN, or the operational parameters computed from the time series set of battery report indexes, and the vault condition recovery report 415 form a given training example for the learning process 305. Specifically, the time series set of battery report indexes 405 contains a time series of operational parameters 410 describing operational conditions of the battery 270 over time, and the vault condition recovery report 415 describing the battery 270 response (post recovery charge state) exhibited by the battery 270 after a deep discharge event associated with a vault operation and subsequent battery recharge operation. This training example is then used, as shown in FIG. 3, to help train the linear regression model to learn a regression between the post recovery charge state of the battery and the set of reported operational parameters.

Figure 5:
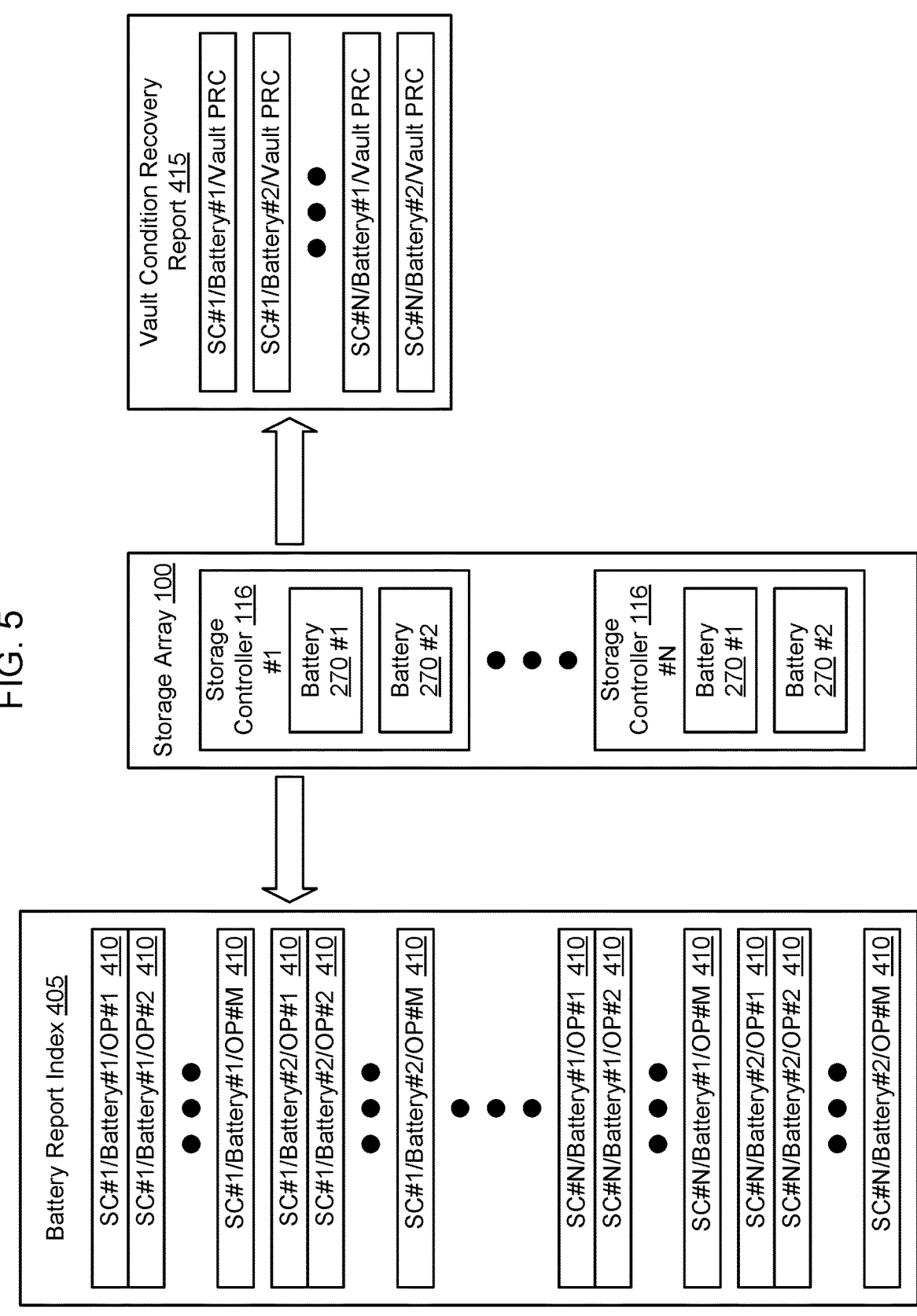
FIG. 5 is a block diagram of an example battery report index and vault condition recovery report forming a portion of the example training sample of FIG. 4, according to some embodiments.

FIG. 5 is a block diagram of an example battery report index 405 and vault condition recovery report 415 forming a portion of the example training sample of FIG. 4, according to some embodiments. As noted herein, a given storage array may include multiple storage controllers 116, and each storage controller 116 may include multiple batteries 270. For example, a given storage array 100 may have 16 or more storage controllers 116, and each storage controller 116 may have two (redundant) batteries 270. Accordingly, a given battery report index 405 from a storage array 100 may include information about multiple operational parameters 410 of multiple batteries 270. Likewise, if a vault operation occurs, the vault operation may be isolated to one storage controller 116, a subset of the storage controllers 116, or may affect all storage controllers 116 of the storage array 100. The vault condition recovery report 415, accordingly, may include battery recovery information about one battery 270 or multiple batteries 270 for the storage array 100, which are used to create one or more training samples to be used to train the learning process 305.

Figure 6:
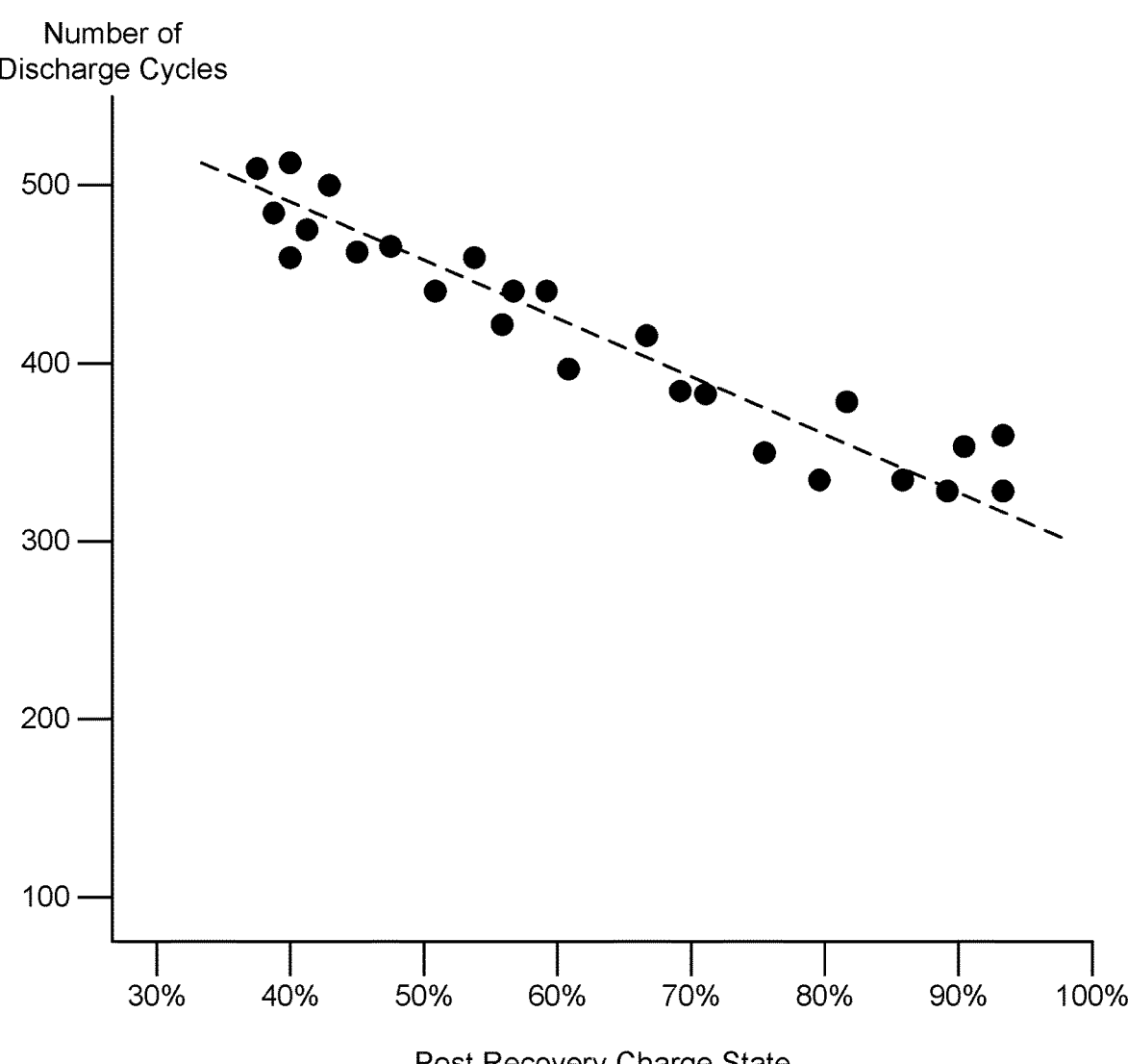
FIG. 6 is a graph of a hypothetical variation of a battery post recovery charge state vs a first operational parameter, namely a number of battery discharge cycles, according to some embodiments.

FIG. 6 is a graph of a hypothetical variation of a battery post recovery charge state vs a first operational parameter 410, namely a number of battery discharge cycles, according to some embodiments. In the graph shown in FIG. 6, each dot represents a training sample. The training samples are created when vault operations occur on storage controllers 116 that result in a battery 270 on the storage controller 116 being deeply discharged and then recharged after completion of the vault operation. The training examples are taken from storage controllers 116 deployed in many different storage arrays 100, with different environmental conditions, and the graph shown in FIG. 6 is intended merely to isolate one particular operational parameter 410. As shown in FIG. 6, in some embodiments the number of battery discharge cycles has a statistically significant gradient descent which indicates that the number of battery discharge cycles is one operational parameter 410 that may be learned by the learning process 305 and used to update the linear regression model. In some embodiments the gradient descent is used as the weighting factor describing the contribution of the number of discharge cycles on the predicted post recovery charge state of the battery 270. As shown in FIG. 6, in this example a higher number of battery discharge cycles is associated with a lower post recovery charge state, whereas a lower number of battery discharge cycles is associated with a higher post recovery charge state, the other operating parameters being equal.

Figure 7:
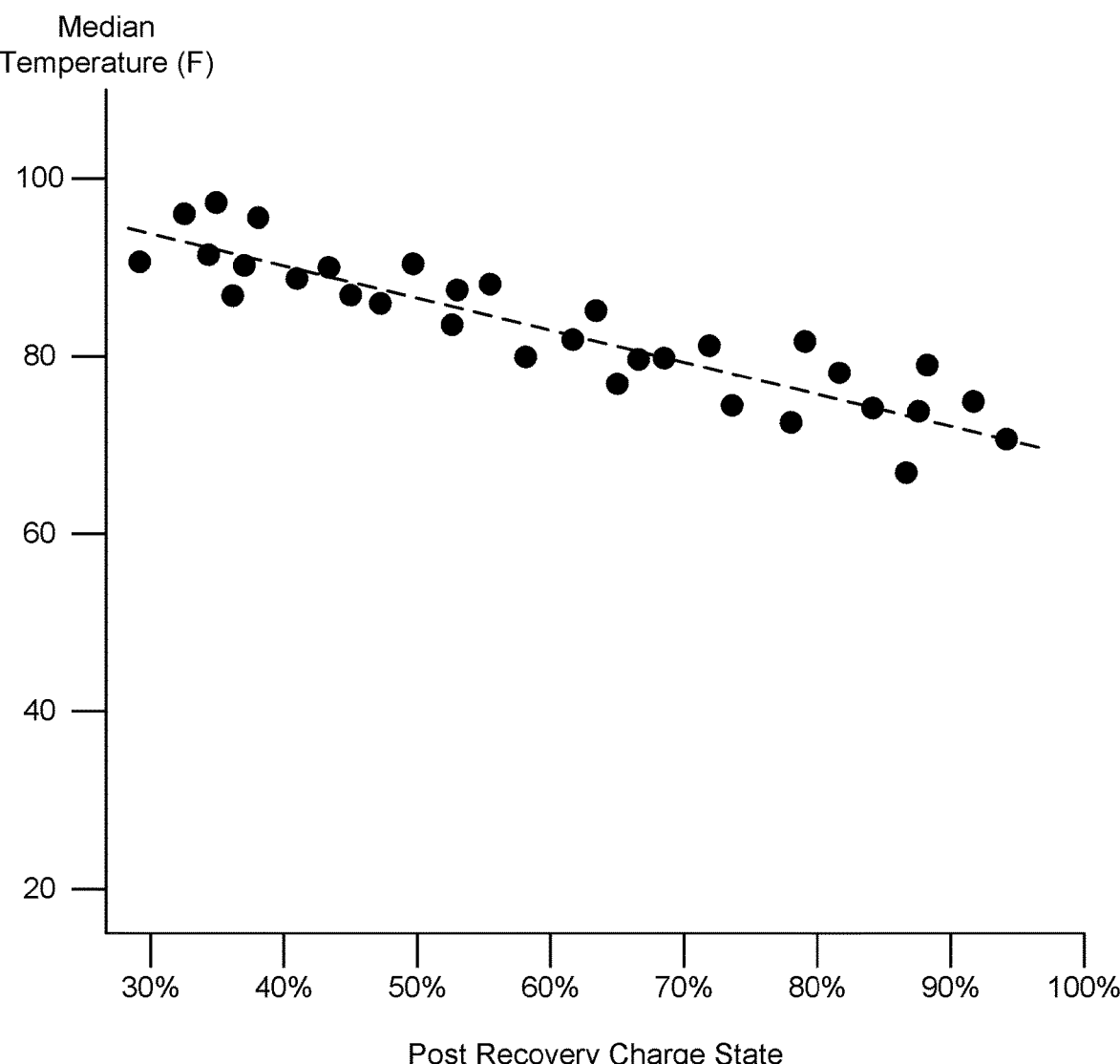
FIG. 7 is a graph of a hypothetical variation of a battery post recovery charge state vs a second operational parameter, namely a battery median temperature, according to some embodiments.

FIG. 7 is a graph of a hypothetical variation of a battery post recovery charge state vs a second operational parameter 410, namely a battery median temperature, according to some embodiments. In FIG. 7, like FIG. 6, each dot represents a given training sample, and represents the median temperature of the respective battery 270 over time, as determined from the set of battery report indexes 405 for the battery 270 over the set of time intervals preceding the vault operation. As shown in FIG. 7, in some embodiments the median battery temperature has a statistically significant gradient descent which indicates that the median battery temperature is a confounding factor with the number of discharge cycles that would be expected to affect the post recovery charge state of the battery 270 and, hence, represents an additional operational parameter 410 that may be learned by the learning process 305 and used to update the linear regression model. In some embodiments the gradient descent is used to learn the weighting factor describing the contribution of the median battery temperature on the predicted post recovery charge state of the battery 270. As shown in FIG. 7, in this example a higher median battery temperature over time is associated with a lower post recovery charge state, whereas a lower median battery temperature over time is associated with a higher post recovery charge state, the other operating parameters being equal.

FIG. 8 is a flowchart of an example method of intelligent predictive battery replacement to increase disaster recovery stability, according to some embodiments. As shown in FIG.

8, in some embodiments a set of training examples from multiple storage controllers 116 deployed in multiple storage arrays 100 is obtained (block 800). Each training example includes a time series set of battery operational parameters 410 (blocks 810-830), and a post recovery charge state of the battery 270 (block 835) describing the charge characteristics of the battery 270 before, during, and after a discharge/recharge cycle associated with a vault operation. Example operational parameters 410, in some embodiments, include the number of partial and/or deep discharge cycles of the battery 270 (block 810), the median temperature of the battery 270 over the period of time encompassed by the time-series (block 815), the designed deliverable capacity of the battery 270 (block 820), the amount of time the battery 270 has been in service (block 825), and the expected service life of the battery 270 (block 830). Other embodiments may include additional operational parameters and/or a different selection of operational parameters.

The training examples are used to train a linear regression machine learning process 305 to learn a constant value PRC$_0$ and a set of weights W1, W2, W3, . . . . WN describing battery post recovery charge state response to occurrence of a vault operation based on battery operational parameters 410 (block 805). In some embodiments, the linear regression learns the battery post recovery charge state as the response variable, and the operational parameters 410 are the explanatory or predictor variables. In some embodiments, the linear regression model 305 is trained to learn the post recovery charge of a battery 270 after a vault operation, based on a set of operational parameters 410 of the battery 270 (block 805).

Once trained, the linear regression machine learning process is deployed (block 840), and used in a predictive manner to estimate a battery post recovery charge state given a set of operational parameters 410 associated of a particular battery 270. For example, as shown in FIG. 8, once the trained linear regression machine learning process is deployed (block 840), a set of operational parameters 410 of a battery 270 deployed on a storage controller 116 is obtained (block 845). The operational parameters 410 are then used by the linear regression machine learning process to predict a post recovery charge state of the battery 270 if the battery 270 was used to implement a vault operation (block 850).

The predicted battery post recovery charge state (output of block 850) is then compared against a vault Service Level Objective (SLO) for the battery 270 in the context of the storage controller 116, to determine if the predicted post recovery charge state causes the battery 270 to fall within a healthy or unhealthy range (block 855). For example, if the SLO for the battery 270 is such that the battery 270 is used to provide sufficient power for two consecutive vault operations, and each vault operation is expected to use 40% of the original battery capacity, a determination in block 855 that the predicted battery post recovery charge state is at or below 80% can result in an interpretation that the battery 270 is not healthy (a determination of NO at block 855), since the prediction is that the battery 270 may marginally be able to provide enough power to satisfy the vault SLO or not able to provide enough power to satisfy the vault SLO. In the event that the predicted battery post recovery charge state is above 80%, a determination is made that the battery 270 is healthy (a determination of YES at block 855), since it appears that the battery 270 is expected to have sufficient capacity to satisfy the vault SLO upon occurrence of a vault operation. Different ways of determining a healthy/unhealthy state of a given battery 270 may vary, depending on the particular vault SLO to be applied to the battery 270, the initial deliverable capacity 820, and the post recovery charge state to be achieved to meet the vault SLO. In some embodiments, determining whether the battery is healthy or not healthy (block 855) is implemented using a threshold and comparing the predicted post recovery charge state of the battery with the threshold.

In instances where the battery post recovery charge state is predicted to be at a level where the battery 270 is determined to be healthy (a determination of YES at block 855), the predictive battery replacement process determines that the battery 270 does not need to be replaced to increase disaster recovery stability and, accordingly, a battery healthy state is returned (block 860). A subsequent battery 270 is then selected for evaluation.

In instances where the battery post recovery charge state is predicted to be at a level where the battery 270 is determined to not be healthy (a determination of NO at block 855), the predictive battery replacement process determines that the battery 270 needs to be replaced to increase disaster recovery stability. As noted above, the trained linear regression machine learning process 305 includes a learned weighted set of operational parameters 410 which collectively are used in connection with Equation 1 to determine a predicted post recovery charge state for a given battery based on a set of observed operational parameters of the given battery. In instances where the battery 270 has been determined to be not healthy (a determination of NO at block 855), the operational parameters 410 that most contributed to the unhealth status determination are identified (block 865). The unhealthy battery prediction is then output as part of a report identifying the battery 270 as unhealthy (block 870) and also identifying a subset of the operational parameters 410 that caused the battery 270 to be identified as unhealthy (block 875).

Identifying the operational parameters 410 that caused the battery 270 to be determined to be unhealthy enables additional insight into the root cause of why the battery 270 needs to be replaced. For example, in instances where one of the operational parameters 410 is median battery temperature, and the median battery temperature of the unhealthy battery has been determined to be elevated, it is possible to include elevated temperature the reason for accelerated replacement of the battery 270 in the output report. This enables a person responsible for managing the storage array to know to increase cooling of the data center or of the storage array, to lower the temperature of the batteries to extent the battery life. Similarly, in instances where the battery capacity is initially too low, such that a small reduction in post recovery charge state can cause the battery 270 to be deemed unhealthy, identifying the initial battery capacity as the reason for accelerated replacement of the battery 270 enables a battery of higher capacity to be used as a replacement.

In some embodiments, the intelligent predictive battery replacement system increases disaster recovery stability by generating alerts to notify when batteries are predicted to be in an unhealthy state or are approaching thresholds associated with a determination of being unhealthy (block 875). Optionally, in addition to generating alerts, the intelligent predictive battery replacement system may be configured to automatically order replacement batteries (block 880) when a battery is predicted to be unhealthy (a determination of NO at block 855). After adding the unhealthy battery information to the report, and optionally automatically ordering a replacement battery for the battery that was identified as being unhealthy, a next battery 270 is selected for evaluation.

The methods described herein may be implemented as software configured to be executed in control logic such as contained in a CPU (Central Processing Unit) or GPU (Graphics Processing Unit) of an electronic device such as a computer. In particular, the functions described herein may be implemented as sets of program instructions stored on a non-transitory tangible computer readable storage medium. The program instructions may be implemented utilizing programming techniques known to those of ordinary skill in the art. Program instructions may be stored in a computer readable memory within the computer or loaded onto the computer and executed on computer's microprocessor. However, it will be apparent to a skilled artisan that the logic described herein can be embodied using discrete components, integrated circuitry, programmable logic used in conjunction with a programmable logic device such as a FPGA (Field Programmable Gate Array) or microprocessor, or any other device including any combination thereof. Programmable logic can be fixed temporarily or permanently in a tangible non-transitory computer readable medium such as random-access memory, a computer memory, a disk drive, or other storage medium. Such embodiments are intended to fall within the scope of the present invention.

Throughout the entirety of the present disclosure, use of the articles "a" or "an" to modify a noun may be understood to be used for convenience and to include one, or more than one of the modified noun, unless otherwise specifically stated. The term "about" is used to indicate that a value includes the standard level of error for the device or method being employed to determine the value. The use of the term "or" in the claims is used to mean "and/or" unless explicitly indicated to refer to alternatives only or the alternatives are mutually exclusive, although the disclosure supports a definition that refers to only alternatives and to "and/or." The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and also covers other unlisted steps. Method steps can be performed in any or different order and are not limited to the order shown in the figures or described herein.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Various changes and modifications of the embodiments shown in the drawings and described in the specification may be made within the spirit and scope of the present invention. Accordingly, it is intended that the matter contained in the above description and shown in the accompanying drawings be interpreted in an illustrative and not in a limiting sense. The invention is limited only as defined in the following claims and the equivalents thereto.

What is claimed is:

1. A method of intelligent predictive battery replacement to increase disaster recovery stability, comprising:
    obtaining a trained linear regression model learning process that has been trained to learn a constant and a set of weights describing a regression between a set of battery operational parameters as explanatory variables and a battery post recovery charge state as a response variable;
    obtaining a set of operational parameters of a given battery;
    providing the obtained set of operational parameters of the given battery as input to the trained linear regression model learning process;
    obtaining, as output from the trained linear regression model learning process, a predicted post recovery charge state of the given battery, the post recovery charge state of the given battery describing an expected capacity of the given battery after being recharged after occurrence of a deep discharge event of the given battery;
    using the predicted post recovery charge state of the given battery output by the trained linear regression model learning process to classify the given battery as either capable of meeting a vault Service Level Objective (SLO) or not capable of meeting the vault SLO; and
    in response to a determination that the given battery is not capable of meeting the vault SLO, the method further comprising automatically scheduling replacement of the given battery.

2. The method of claim 1, wherein the trained linear regression model learning process is a machine learning model that has been trained using unlabeled training examples, each unlabeled training example including a time series set of battery report indexes and a vault condition recovery report.

3. The method of claim 2, wherein each battery report index contains battery operational parameters for a given battery during a particular time interval.

4. The method of claim 3, wherein the set of battery operational parameters comprises a number of discharge cycles of the given battery, a median temperature of the battery, and an amount of time the given battery has been maintained in a charged state.

5. The method of claim 2, wherein the vault condition recovery report is generated in connection with a deep discharge event of the given battery, and comprises a percent battery charge state prior to the deep discharge event, a percentage battery discharge value during the deep discharge event, and a percentage battery post recovery charge state after the given battery has been recharged after conclusion of the deep discharge event.

6. The method of claim 5, wherein the battery post recovery charge state is an amount of an original capacity of the given battery that the given battery is able to hold after the given battery is used to implement the deep discharge event.

7. The method of claim 1, wherein using the predicted post recovery charge state of the given battery output by the trained linear regression model learning process to classify the given battery as either capable of meeting the vault Service Level Objective (SLO) or not capable of meeting the vault SLO comprises comparing the predicted post recovery charge state of the given battery with a threshold post recovery charge state associated with a minimum post recovery charge state required to meet the vault SLO.

8. The method of claim 1, in response to a determination that the given battery is not capable of meeting the vault SLO, the method further comprising generating a notification identifying the given battery as a candidate for replacement.

9. The method of claim 8, in response to a determination that the given battery is not capable of meeting the vault SLO, the method further comprising identifying a primary operational parameter of the obtained set of operational parameters for the given battery that primarily contributed to the determination that the given battery is not capable of meeting the vault SLO, and including the identified primary operational parameter in the notification.

10. The method of claim 1, in response to a determination that the given battery is not capable of meeting the vault SLO, the method further comprising automatically ordering a replacement battery for the given battery.

11. The system of claim 1, in response to a determination that the given battery is not capable of meeting the vault SLO, the method further comprising automatically ordering a replacement battery for the given battery.

12. A system for intelligent predictive battery replacement to increase disaster recovery stability, comprising:

one or more processors and one or more storage devices storing instructions that are operable, when executed by the one or more processors, to cause the one or more processors to perform operations comprising:

obtaining a trained linear regression model learning process that has been trained to learn a constant and a set of weights describing a regression between a set of battery operational parameters as explanatory variables and a battery post recovery charge state as a response variable;

obtaining a set of operational parameters of a given battery;

providing the obtained set of operational parameters of the given battery as input to the trained linear regression model learning process;

obtaining, as output from the trained linear regression model learning process, a predicted post recovery charge state of the given battery, the post recovery charge state of the given battery describing an expected capacity of the given battery after being recharged after occurrence of a deep discharge event of the given battery; and using the predicted post recovery charge state of the given battery output by the trained linear regression model learning process to classify the given battery as either capable of meeting a vault Service Level Objective (SLO) or not capable of meeting the vault SLO; and in response to a determination that the given battery is not capable of meeting the vault SLO, the method further comprising automatically scheduling replacement of the given battery.

13. The system of claim 12, wherein the trained linear regression model learning process is a machine learning model that has been trained using unlabeled training examples, each unlabeled training example including a time series set of battery report indexes and a vault condition recovery report.

14. The system of claim 13, wherein each battery report index contains battery operational parameters for a given battery during a particular time interval.

15. The system of claim 14, wherein the set of battery operational parameters comprises a number of discharge cycles of the given battery, a median temperature of the battery, and an amount of time the given battery has been maintained in a charged state.

16. The system of claim 13, wherein the vault condition recovery report is generated in connection with a deep discharge event of the given battery, and comprises a percent battery charge state prior to the deep discharge event, a percentage battery discharge value during the deep discharge event, and a percentage battery post recovery charge state after the given battery has been recharged after conclusion of the deep discharge event.

17. The system of claim 16, wherein the battery post recovery charge state is an amount of an original capacity of the given battery that the given battery is able to hold after the given battery is used to implement the deep discharge event.

18. The system of claim 12, wherein using the predicted post recovery charge state of the given battery output by the trained linear regression model learning process to classify the given battery as either capable of meeting the vault Service Level Objective (SLO) or not capable of meeting the vault SLO comprises comparing the predicted post recovery charge state of the given battery with a threshold post recovery charge state associated with a minimum post recovery charge state required to meet the vault SLO.

19. The system of claim 12, in response to a determination that the given battery is not capable of meeting the vault SLO, the method further comprising generating a notification identifying the given battery as a candidate for replacement.

20. The system of claim 19, in response to a determination that the given battery is not capable of meeting the vault SLO, the method further comprising identifying a primary operational parameter of the obtained set of operational parameters for the given battery that primarily contributed to the determination that the given battery is not capable of meeting the vault SLO, and including the identified primary operational parameter in the notification.

* * * * *